US011009658B2

(12) United States Patent
Jones et al.

(10) Patent No.: US 11,009,658 B2
(45) Date of Patent: May 18, 2021

(54) WAVEGUIDE INTEGRATED PLASMON ASSISTED FIELD EMISSION DETECTOR

(71) Applicant: California Institute of Technology, Pasadena, CA (US)

(72) Inventors: William M. Jones, Pasadena, CA (US); Lucia B. De Rose, Pasadena, CA (US); Axel Scherer, Barnard, VT (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 16/803,938

(22) Filed: Feb. 27, 2020

(65) Prior Publication Data

US 2020/0278294 A1    Sep. 3, 2020

Related U.S. Application Data

(60) Provisional application No. 62/812,748, filed on Mar. 1, 2019.

(51) Int. Cl.
*G02B 6/122* (2006.01)
*H01L 31/0232* (2014.01)
*G01J 1/04* (2006.01)

(52) U.S. Cl.
CPC .......... *G02B 6/1226* (2013.01); *G01J 1/0425* (2013.01); *H01L 31/02327* (2013.01); *G01N 2201/0873* (2013.01)

(58) Field of Classification Search
CPC .... G01J 1/02; G01J 1/0204; G01J 1/04; G01J 1/0407; G01J 1/0425; G02B 6/1226; G02B 6/12; G02B 6/12004; G02B 5/008; G02B 6/1213; G02B 6/42; G01N 2201/0873; H01L 31/02327
See application file for complete search history.

(56) References Cited

U.S. PATENT DOCUMENTS 7,373,058 B2 *    5/2008  Hochberg ............. B82Y 20/00
                                                  385/12
7,418,179 B2 *    8/2008  Estes ..................... B82Y 20/00
                                                  385/129

(Continued)

FOREIGN PATENT DOCUMENTS

KR    20110004236 A    1/2011
KR    20140075410 A    6/2014
KR    20150055389 A    5/2015

OTHER PUBLICATIONS

International Search Report and Written Opinion for PCT App. No. PCT/US2020/020227 filed on Feb. 27, 2020 on behalf of California Institute of Technology, dated Jun. 26, 2020. 11 Pages.

(Continued)

*Primary Examiner* — Gordon J Stock, Jr.
(74) *Attorney, Agent, or Firm* — Steinfl + Bruno, LLP

(57) ABSTRACT

Light detectors that combine field emission with light focusing by surface plasmon polaritons. Methods and devices that allow detection and measurement of light at high frequencies in the THz range are described. The disclosed devices include plasmonic metal contacts with a narrow nanometer-sized gap to couple an optical waveguide mode into a plasmonic mode thereby generating filed emission currents by biasing the contacts.

16 Claims, 6 Drawing Sheets

(56) References Cited

U.S. PATENT DOCUMENTS

| | | | | |
|---|---|---|---|---|
| 7,515,793 | B2* | 4/2009 | Dehlinger | G02B 6/12004 |
| | | | | 385/129 |
| 8,755,662 | B2* | 6/2014 | Kim | G02F 1/025 |
| | | | | 385/131 |
| 8,802,481 | B2* | 8/2014 | Ahn | H01L 31/1013 |
| | | | | 438/69 |
| 8,809,834 | B2* | 8/2014 | Ahn | H01L 31/1804 |
| | | | | 257/14 |
| 8,958,670 | B2* | 2/2015 | Delacour | G02B 6/1226 |
| | | | | 385/39 |
| 9,063,254 | B2* | 6/2015 | Block | H01L 31/105 |
| 9,329,339 | B2* | 5/2016 | Bai | B82Y 20/00 |
| 10,276,734 | B2* | 4/2019 | Muhlbrandt | H01L 31/03529 |
| 2012/0006981 | A1* | 1/2012 | Van Dorpe | G02B 6/1226 |
| | | | | 250/227.11 |
| 2012/0280345 | A1* | 11/2012 | Zhu | G02B 6/12004 |
| | | | | 257/432 |
| 2017/0315420 | A1 | 11/2017 | Watts et al. | |
| 2018/0081204 | A1 | 3/2018 | Ma et al. | |
| 2020/0003696 | A1* | 1/2020 | Pleros | G01N 21/7703 |
| 2020/0119205 | A1* | 4/2020 | Gosciniak | H01L 31/02005 |

OTHER PUBLICATIONS

Jones, W. M., et al., Nanoscale Field Emissions Devices. Dissertation (Ph.D.), California Institute of Technology. doi:10.7907/Z94B2ZHZ. https://resolver.caltech.edu/CaltechTHESIS:12132017-132404589 Thesis made available for public view on Jan. 23, 2019. 129 Pages.

* cited by examiner

WAVEGUIDE INTEGRATED PLASMON ASSISTED FIELD EMISSION DETECTOR

CROSS REFERENCE TO RELATED APPLICATIONS

The present application claims priority to U.S. Provisional Application 62/812,748 filed on Mar. 1, 2019, the contents of which are incorporated herein by reference in their entirety.

FIELD

Throughout this document the term surface plasmon polariton is used to refer to a quasi particle (i.e. a combination of an electromagnetic wave in a dielectric and collective motion of electrons in a metal). Both combine to make wave phenomena, a surface plasmon polariton, that travels along the surface of a dielectric and a metal.

The presented disclosure is related to light detectors, and more particularly to plasmon assisted field emitting detectors, a new class of light detectors that combine the physics of field emission with that of focusing of light by surface plasmon polaritons.

BACKGROUND

Photodetectors include devices such as photomultiplier tubes, bolometers and semiconductor detectors. Fast detectors typically require the use of semiconductor materials that convert photons to electron-hole pairs and change the conductivity or provide photocurrent. Generally, the energy of the photon must exceed a threshold energy, usually the bandgap, which enables electrons or holes to be generated and measured. These carriers have to move to electrical contacts before they can be detected, and this carrier transit time typically limits the ultimate frequency response of a photodetector. In designing a high frequency detector, the capacitance of the device and distance between carrier generation and contacts are generally minimized. Amplification of electrical signal is accomplished by introducing either a transistor or a carrier multiplication mechanism such as an avalanche photodiode or integrated phototransistors.

FIG. 1 shows a prior art germanium (Ge) p-n diode detector (100) integrated on a silicon (Si) waveguide. By coupling light from the 6 µm diameter mode of a glass fiber (110) into a 200×400 nm Si waveguide (120), the optical field is concentrated by a factor of over 300×. Typically, the waveguide consists of a different material than the detecting material, as light should not be absorbed before it can reach the detecting region. In FIG. 1, light is detected through a reverse-biased in-plane p-n diode (130), and current between contact (141) and contact (142) is measured. In this case, light is coupled from the Si waveguide (120) into the Ge detector region, and electron-hole pairs are generated in the depletion region of the p-n diode (130).

The operating frequency limit of the detector (100) of FIG. 1 is typically determined by the distance between the contacts and the carrier generation region. It should be noted that the maximum velocity of electrons in semiconductors is limited to the saturation velocity, which for silicon is approximately $1 \times 10^7$ cm/s, and is approximately 2× higher for InP and GaAs. For carriers moving 100 nm in the semiconductor waveguide/detector region, this translates into a transit time of about $10^{-12}$ seconds, or a fundamental frequency limitation of the photodetector to 1 THz. Therefore, there is a need for faster photodetectors functioning at higher frequencies, above 1 THZ.

SUMMARY

The methods and devices disclosed address the above-mentioned problem. The described class of photodetectors is able to transcend the limitation and speed issues mentioned above, and can work at higher frequencies while offering the potential for high sensitivity and low noise.

According to a first aspect of the present disclosure, a method of detecting and measuring light is disclosed, providing: providing first and second plasmonic metal contacts separated by a gap in a range of 10 to 50 nm to form a plasmon waveguide; coupling the first and the second plasmonic metal contacts with an on-chip optical waveguide having a first refractive index, the optical waveguide being separated vertically from the plasmon waveguide by a dielectric layer having a second refractive index, the second refractive index being greater than one and less than the first refractive index; coupling light into the optical waveguide to generate an optical mode; applying a biasing voltage to the first and the second plasmonic metal contacts; and configuring the plasmon waveguide such that the optical mode is coupled into a plasmon mode within the gap, thereby generating a field emission current as a function of an intensity of the light, the field emission current flowing through the gap from the first to the second plasmonic metal contact According to a second aspect of the present disclosure, a photodetector is provided, comprising: an optical waveguide connected with a plasmonic waveguide, the plasmonic waveguide comprising first and a second plasmonic metal contacts separated by a gap of 10 nm to 50 nm, wherein: the optical waveguide is configured to receive light to generate an optical mode; and the plasmonic waveguide is configured to allow coupling of the optical mode into a plasmonic mode within the gap.

Further aspects of the disclosure are provided in the description, drawings and claims of the present application.

DETAILED DESCRIPTION

According to the teachings of the present disclosure, light can be used to generate very high electromagnetic fields through surface plasmons in appropriately designed nanostructures made from plasmonic metals such as gold, silver, copper, and aluminum or a combination of the same. Such large optical fields can in turn be used to change the Fowler-Nordheim emission characteristics of field emitters. By illuminating, for example, gold field emitters with light, their electronic performance may be changed and optically active electronic amplifiers that may be used as high-frequency photodetectors can be obtained.

Figure 1:
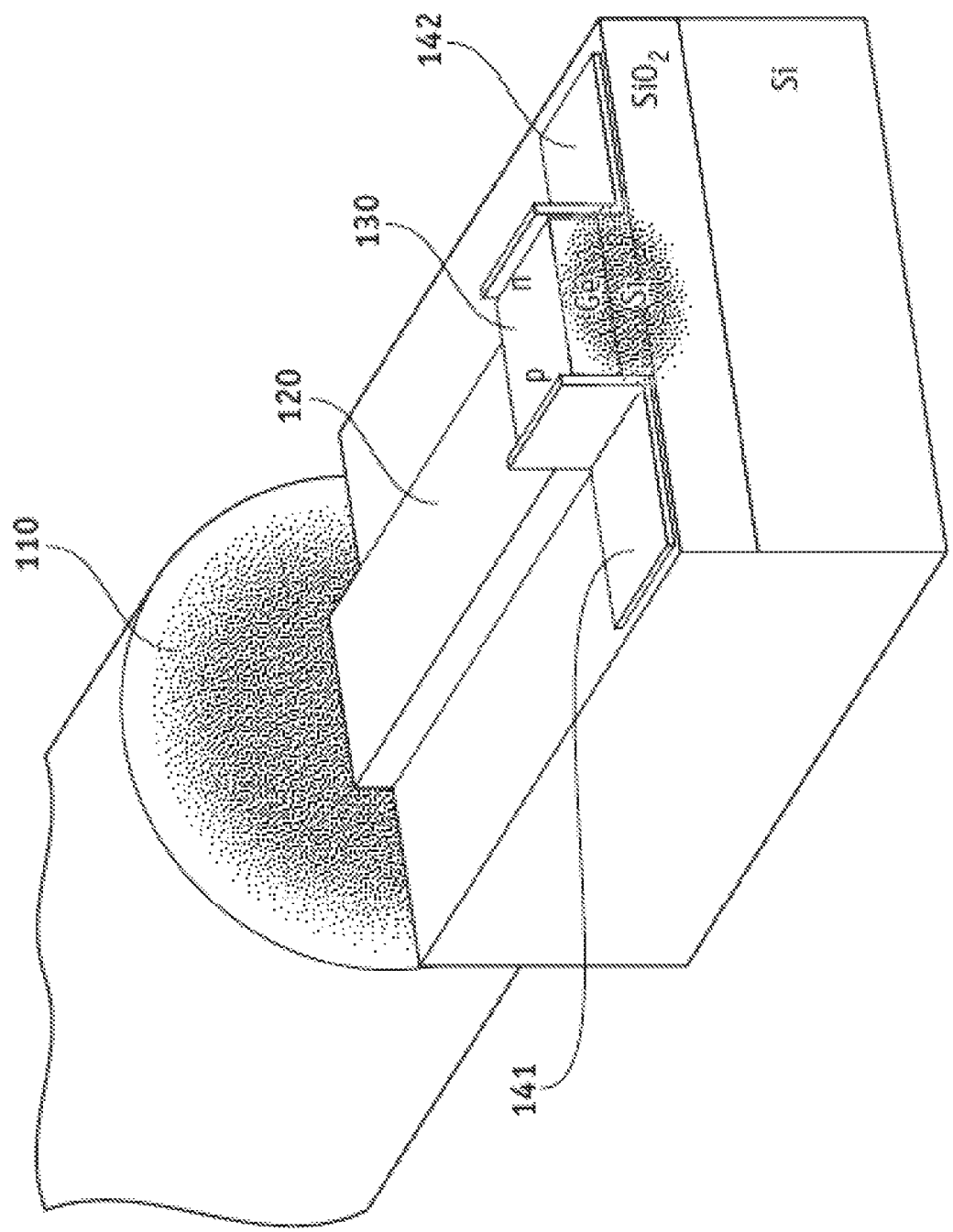
FIG. 1 shows a prior art Ge PN diode detector.
Figure 2:
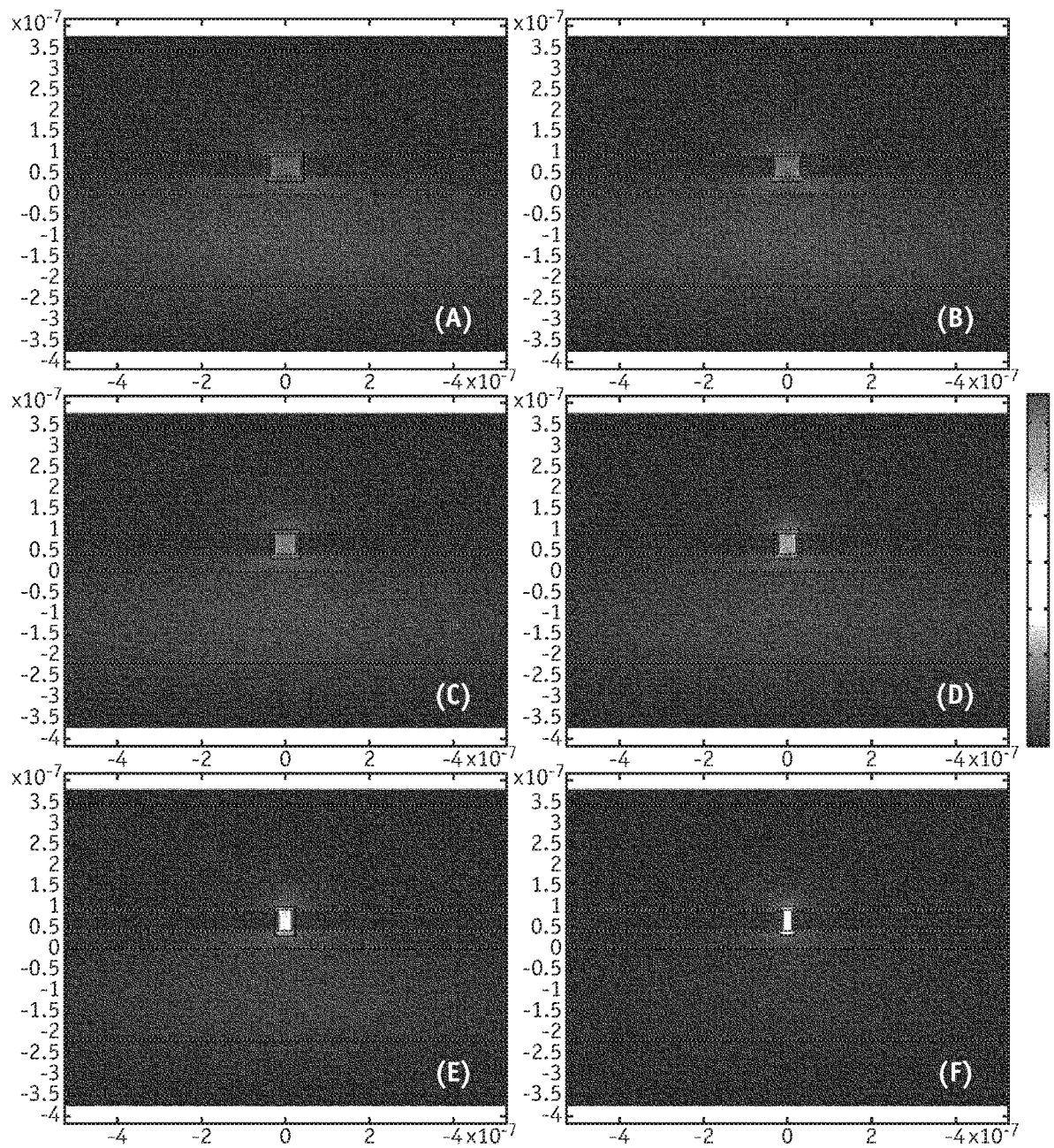
FIG. 2 shows exemplary modeling results of the topical field intensity within plasmonic waveguides.

Embodiments in accordance with the present disclosure may be made by introducing gaps between, for example, two gold contacts that form a plasmonic waveguide. The plasmonic waveguide can be effectively coupled with an on-chip photonic layer consisting of high index dielectric waveguides by overlapping metal layer on top of the high index waveguide with a thin, lower index, dielectric layer such as silicon dioxide in between. FIG. 2 shows exemplary modeling results of the optical field intensity in cross-sections of such plasmonic waveguides. The inventors have noted that reducing gap width may lead to a localization of the optical field, and a concomitant increase in field intensity. Throughout this document, the equivalent terms "small gap" and "narrow gap" are interchangeably used to describe a gap in the nanometer range between two metal contacts, the two metal contacts being both coupled to and fabricated on the same surface of a dielectric waveguide where through the presence of an optical field, and also field emission, electrons can be moved through the gap from one metal contact to the other, while avoiding the direct tunneling directly between the metal contacts which may undesirably result in a device breakdown. The width of such gaps resides within a range of 10 nm to 50 nm.

As an example of implementation, and according to embodiments of the present disclosure, plamonic triodes may be fabricated wherein the gate of the plasmonic triode can be supplied by biasing a doped silicon dielectric waveguide underneath the plasmonic metal (e.g. gold) contacts. Light in the silicon waveguide can be efficiently coupled into the plasmonic waveguide defined by the plasmonic metal contact structures through an adiabatic mode converter to efficiently connect the optical silicon waveguide mode to the focused hybrid plasmonic mode and minimize insertion losses. The hybrid plasmonic mode may result in a ~100× enhancement of the optical field over that in the silicon waveguide, which leads to a decrease in the absolute magnitude of optical power needed to influence field emission.

Moreover, because light is concentrated by mode-matching and not through a resonator geometry, switching time is not limited by the resonance cavity lifetimes, operational frequencies higher than 1 THz are made possible. In what follows, the concepts disclosed above will be further described using some exemplary embodiments of the disclosure.

Figure 3:
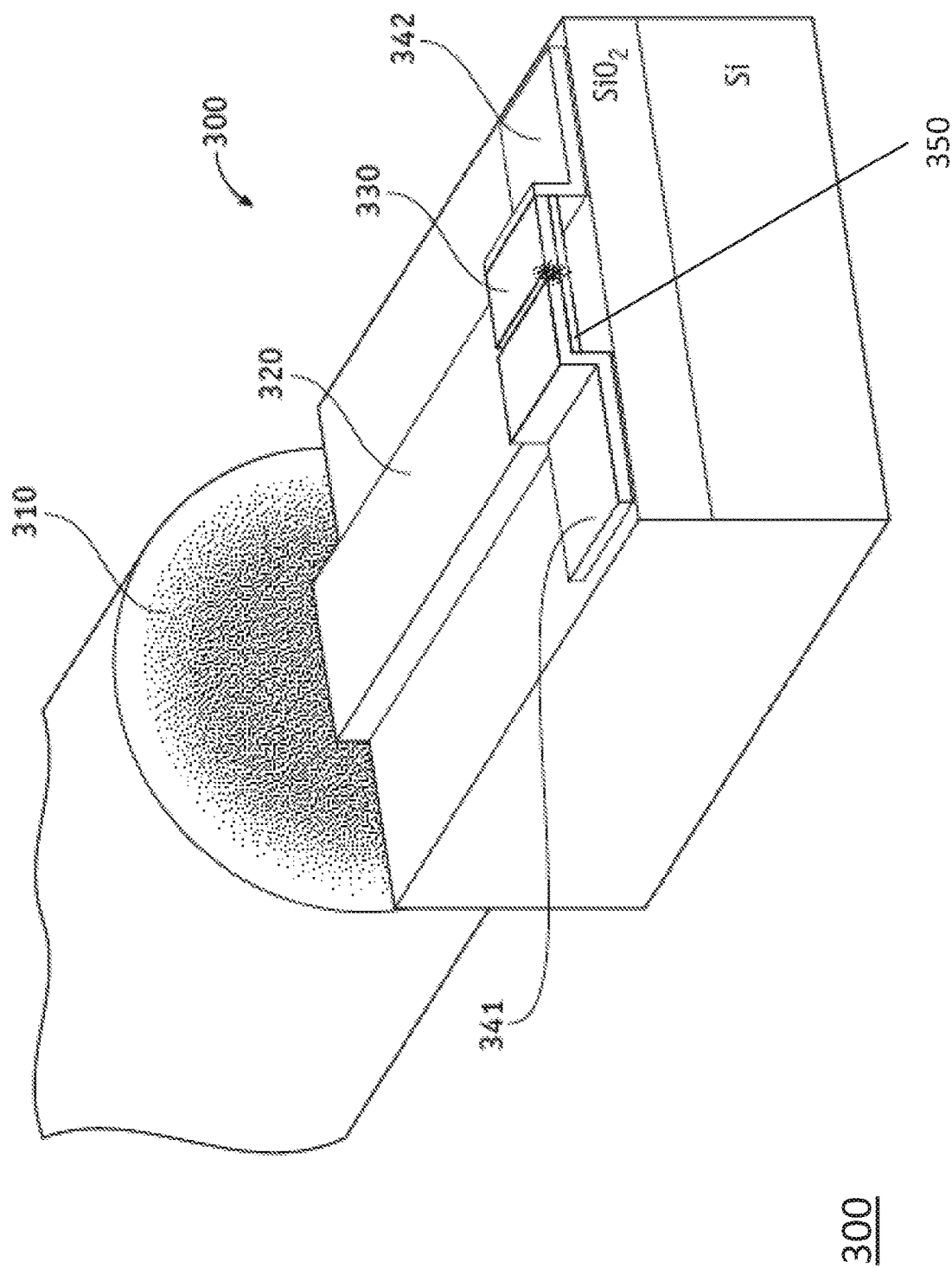
FIG. 3 shows an exemplary photodetector according to an embodiment of the present disclosure.

FIG. 3 shows a photodetector (300) in accordance with an embodiment of the present disclosure. The optical photodetector (300) is essentially a plasmon-assisted field emitter diode comprising an optical waveguide (320) and two plasmonic metal contacts (341, 342) separated by a narrow gap (330) in the nanometer range, the two metal contacts being coupled with the optical waveguide (320) with a thin dielectric layer (350) in the nanometer range placed i) underneath the two metal contacts and ii) between the two metal contacts and the optical waveguide (320). In other words, the thin dielectric layer is provided with a first side connected with the metal contacts (341, 342) and a second side connected with the optical waveguide (320). The optical waveguide (320) may have the structure of a slab waveguide or other waveguide geometry. According to an embodiment of the present disclosure, the thin dielectric layer (350) may have a refractive index of greater than one and less than the refractive index of the optical waveguide (320). In other words, optical waveguide (320) may also be made as a dielectric layer having a refractive index larger than the refractive index of the thin dielectric layer (350). According to further embodiments of the present disclosure, the thin dielectric layer (350) may have two functions: 1) make the plasmonic section less lossy during focusing and 2) reduce the dark current of the photodetector (300) by allowing an undercut of the metal contacts (341, 342), thus removing the leakage pathway from the high E-Field region.

During operation, the photodetector (300) is configured such that light from a fiber (310) is coupled into the high index optical waveguide (320) and then coupled to a plasmon waveguide defined by the gap between contact (341) and contact (342). The optical field, already increased by mode conversion into the high index optical waveguide (320), is again increased by coupling from the high index dielectric waveguide mode into the plasmon mode, with an even smaller mode area and corresponding further concentration of the electric field. Insertion and absorption losses will reduce this final optical field, but in principle, it is possible to obtain very high field intensities. According to embodiments of the present disclosure, the optical waveguide (320) may be made of high index dielectric semiconductors such as silicon and the low index dielectric layer comprises, silicon dioxide, or some other low index material. The low index dielectric layer is built with a thickness in the range of 15 to 25 nm, for example 20 nm.

Figure 4:
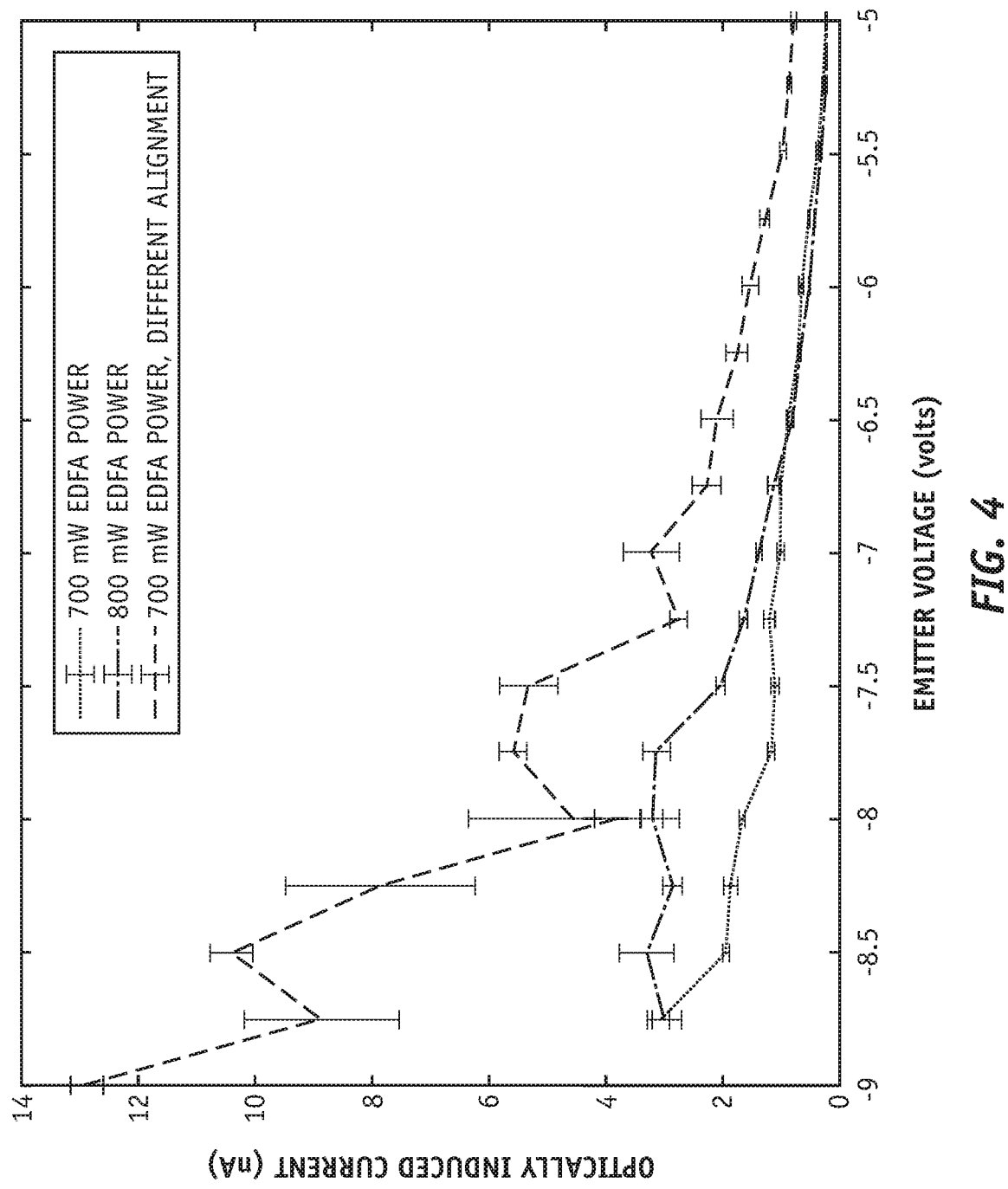
FIG. 4 shows a response of an exemplary optical field emitter in accordance with an embodiment of the present disclosure.

FIG. 4 shows a feasibility test where response of an optical field emitter (emitter voltage) to light (optically induced current) is measured. Light is coupled into the silicon through a very lossy grating coupler, and consequently the quantum efficiency of the detector is lower than expected. As can be seen in FIG. 4, the field emission current between the source and the anode is sensitive to light intensity, focused into the gap between these two contacts through the plasmon waveguide.

Figure 5A:
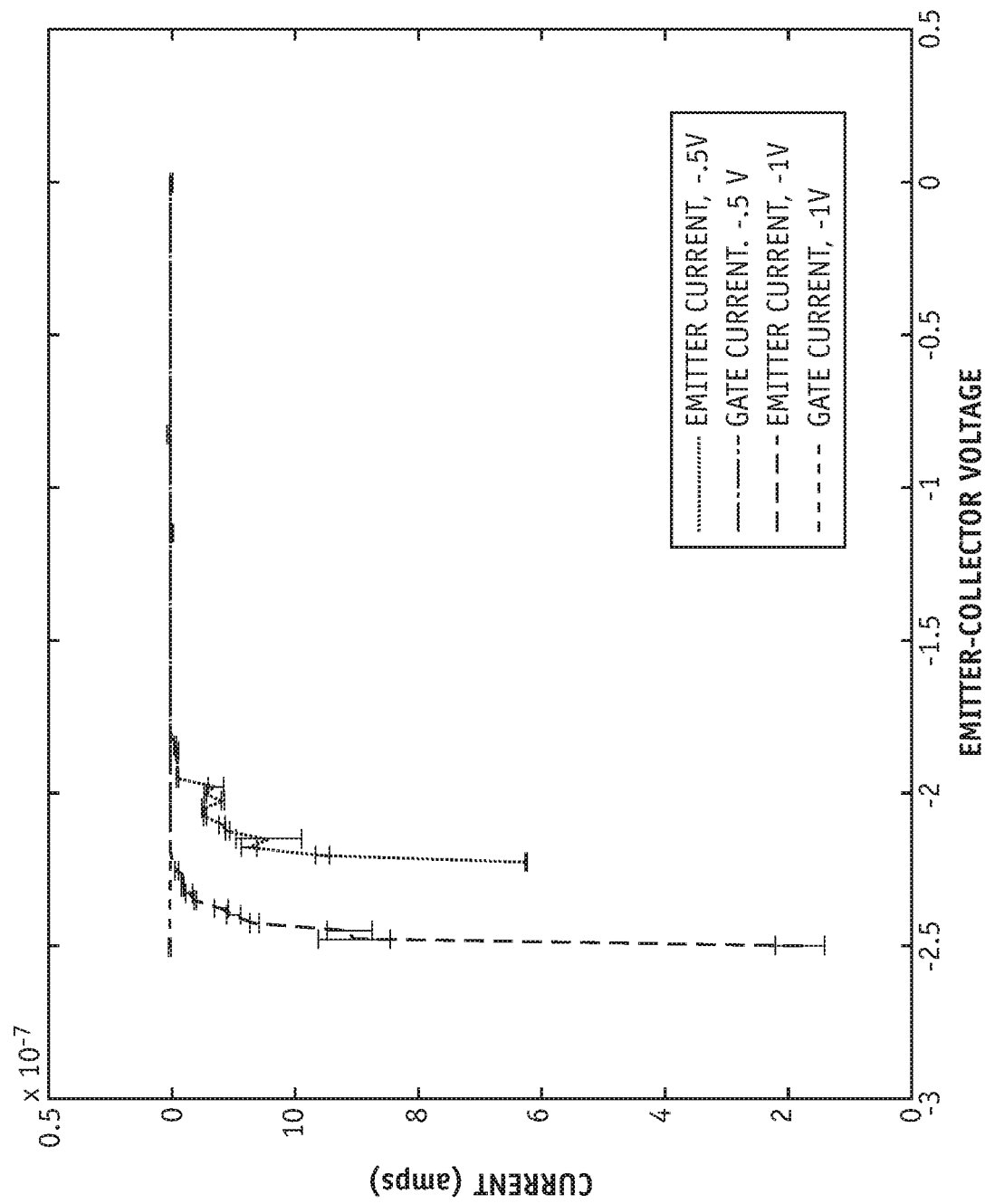
FIG. 5A shows an exemplary gate voltage response of the field emission voltage in accordance with the teachings of the present disclosure.

With reference again to FIG. 3, and considering the geometry of photodetector (300), the field emission current can be changed by introducing a gate close to the contacts (341, 342). A method to gate such a device is to apply a gate voltage to the optical waveguide (320), which in that case would be slightly doped with solid-state dopants such as boron or phosphorous. FIG. 5A shows the field emitter current/voltage characteristic at different gate bias values (when there is no illumination), indicating that such a device functions similar to a three-terminal vacuum triode.

Figure 5B:
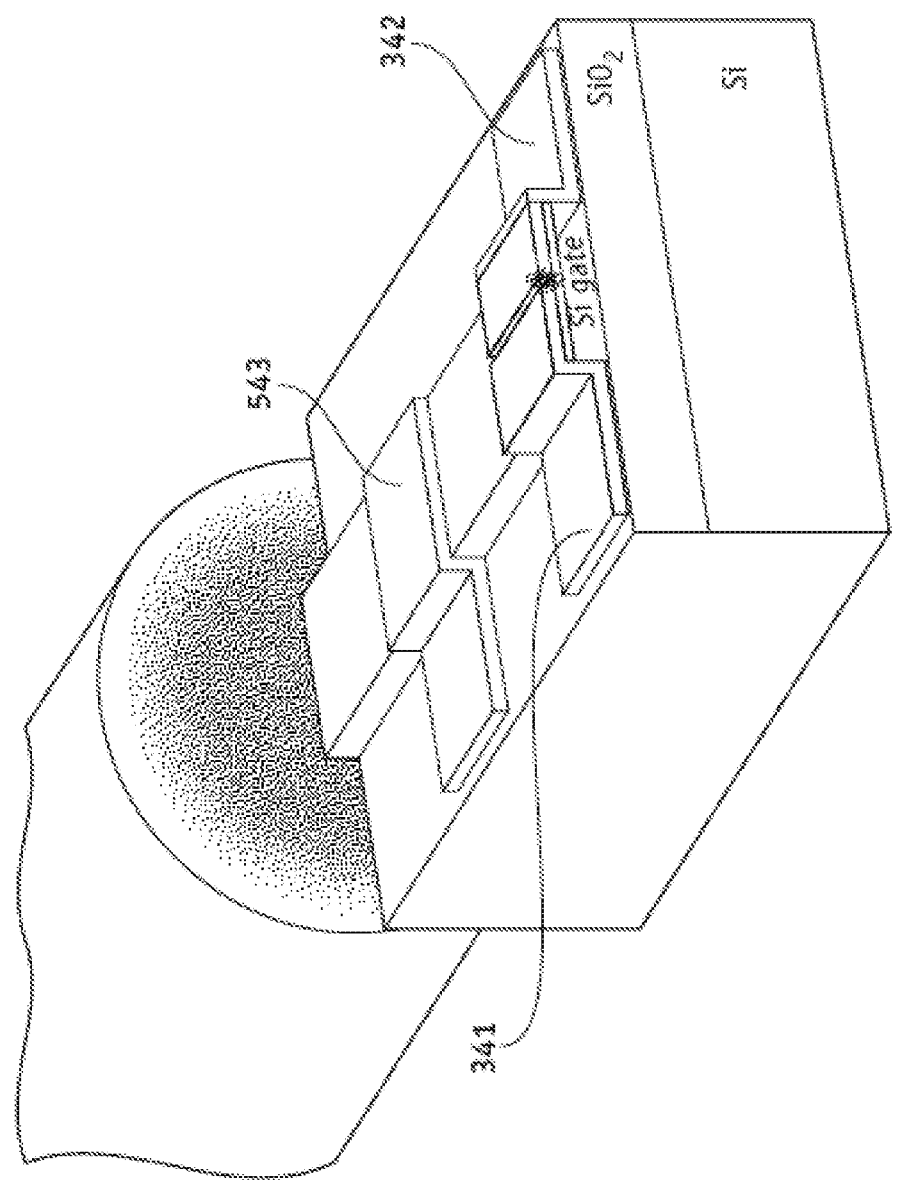
FIG. 5B shows an exemplary photodetector according to further embodiments of the present disclosure.

FIG. 5B shows an optical photodetector (500) structured in accordance with the above expressed considerations. The photodetector (500) has a structure and features that are similar to those described with regards to the photodetector (300) of FIG. 3, with the difference that the optical photodetector (500) further comprises an additional contact (543) for application of a gate voltage to control the field emission current. During operation when there is illumination, the combination of optical and electrostatic field concentration enables the optimization of this device for maximum sensitivity and frequency response, while biasing the device to enable signal amplification.

In analogy to a phototransistor, but without saturation velocity limitations, the plasmon assisted triode can operate at over 1 THz frequencies and it is possible to match the needs of bit-scale data introspection in an optical system that carries Tb/s data without the need for complex serial de-multiplexing circuits.

Because carrier scattering does not limit speed, nanoscale field emitting triodes are expected to be able to operate at THz frequencies, much faster than traditional transistors. However, in realistic circuits, as already noted before, the electronic frequency response is limited by electron scattering in the contacts connecting devices. In summary, based on the above-described teachings of the present disclosure, this scattering can be avoided by optically connecting triodes with plasmonic waveguides as shown for example in the embodiment of FIG. 5B, transmitting signals between these devices at the speed of light. Opto-electronic field emitters built in accordance with the present disclosure are able to combine high electrostatic and electromagnetic fields at the nanoscale level. The use of contacts made of metals such as gold, silver, copper, and aluminum or their combinations acting as electrodes for both plasmon waveguiding and electrostatic field emission allows reduction of interconnect lag times and development of more complex integration and simpler circuit design.

According to the teachings of the present disclosure, field emitter triodes may be integrated with plasmonic and silicon waveguides to define optoelectronic triode circuits. By directly integrating ultra-fast electronics on light waveguides, it will be possible to simplify the multiplexing and demultiplexing circuitry that is required for modern silicon photonics data communications links. Additionally, by integrating electron optics with photonics at the nanoscale level, a class of devices may be made to form the basis for the next generation of opto-electronics, no longer limited by carrier scattering.

Most electro-optical modulators depend on changes in either the absorption or the refractive index of light. Electro-optic polymers with high nonlinearities have been recently developed for non-linear modulators, in which high electrostatic fields are applied onto small gaps to tune the refractive index, thus resulting in electro-optic (EO) devices. Thus, by combining electro-optic materials into small high-field devices like those described in the present disclosure, it will be possible to build EO modulators. Even in vacuum, changes in electron density generate changes in the refractive index, enabling electro-optic vacuum electronic devices. However, larger nonlinearities can be found in EO polymers, especially after these are poled at elevated temperatures in very high electrostatic fields. In accordance with embodiments of the present disclosure, micro-scale electro-optic modulators may be made by using plasmonic waveguides, fabricated into small Mach-Zehnder interferometers in which one leg of the interferometer may be biased, and the other left unperturbed.

The invention claimed is:

1. A method of detecting and measuring light comprising:
   providing first and second plasmonic metal contacts separated by a gap in a range of 10 to 50 nm to form a plasmon waveguide;
   coupling the first and the second plasmonic metal contacts with an on-chip optical waveguide having a first refractive index, the optical waveguide being separated vertically from the plasmon waveguide by a dielectric layer therebetween having a second refractive index, the second refractive index being greater than one and less than the first refractive index;
   coupling light into the optical waveguide to generate an optical mode;
   applying a biasing voltage to the first and the second plasmonic metal contacts; and
   configuring the plasmon waveguide such that the optical mode is coupled into a plasmon mode within the gap, thereby generating a field emission current as a function of an intensity of the light, the field emission current flowing through the gap from the first to the second plasmonic metal contact.

2. The method of claim 1, wherein the first and second plasmonic metal contacts are selected from the group consisting of gold, silver, copper, aluminum, or a combination thereof.

3. The method of claim 1, wherein the light is coupled into the optical waveguide from an optical fiber.

4. The method of claim 1, wherein the dielectric layer has a width in a range of 15 nm to 25 nm.

5. The method of claim 4, wherein the dielectric layer comprises silicon dioxide and the optical waveguide is made of silicon.

6. The method of claim 4, wherein the dielectric layer has a width of 20 nm.

7. A photodetector comprising:
   an optical waveguide having a first refractive index and being connected with a plasmonic waveguide, the plasmonic waveguide comprising first and a second plasmonic metal contacts separated by a gap of 10 nm to 50 nm,
   the optical waveguide being separated vertically from the plasmonic waveguide by a dielectric layer therebetween having a second refractive index, the second refractive index being greater than one and less than the first refractive index, wherein:
   the optical waveguide is configured to receive light to generate an optical mode; and
   the plasmonic waveguide is configured to allow coupling of the optical mode into a plasmonic mode within the gap.

8. The photodetector of claim 7, wherein the optical waveguide receives the light from an optical fiber.

9. The photodetector of claim 7, wherein the first and the second plasmonic metal contacts are configured to receive a bias voltage to generate a field emission current flowing through the gap from the first plasmon metal contact to the second plasmon metal contact.

10. The photodetector of claim 9, wherein the first and/or the second plasmonic metal contacts are selected from the group consisting of gold, silver, copper, aluminum, or a combination thereof.

11. The photodetector of claim 9, further comprising a gate metal contact connected with the optical waveguide, the gate metal contact being configured to receive a voltage to bias the optical waveguide, thereby controlling the field emission current.

12. The photodetector of claim 7, wherein the dielectric layer has a thickness in a 15 nm to 25 nm range, with a first and a second side.

13. The photodetector of claim 12, wherein the low index dielectric layer has a thickness of 20 nm.

14. The photodetector of claim 12, wherein the optical waveguide is configured to receive the light and to couple the light to plasmonic waveguide.

15. The photodetector of claim 14, wherein the dielectric layer comprises silicon dioxide and the optical waveguide comprises silicon.

16. The photodetector of claim 15, wherein the dielectric layer is connected with the first and the second plasmonic metal contacts on the first side, and with the optical waveguide at the second side.

* * * * *